United States Patent [19]

Yachi

[11] Patent Number: 5,578,163
[45] Date of Patent: Nov. 26, 1996

[54] METHOD OF MAKING AN ALUMINUM CONTAINING INTERCONNECT WITHOUT HARDENING OF A SIDEWALL PROTECTION LAYER

[75] Inventor: Masaharu Yachi, Suwa, Japan

[73] Assignee: Seiko Epson Corporation, Tokyo, Japan

[21] Appl. No.: 962,818

[22] Filed: Oct. 19, 1992

[30] Foreign Application Priority Data

Oct. 21, 1991 [JP] Japan .................................. 3-272760
Oct. 25, 1991 [JP] Japan .................................. 3-279114
Oct. 6, 1992 [JP] Japan .................................. 4-293892

[51] Int. Cl.$^6$ .................................................. H01L 21/306
[52] U.S. Cl. ........................................................ 156/643.1
[58] Field of Search ..................................... 156/643, 665

[56] References Cited

U.S. PATENT DOCUMENTS

| | | | |
|---|---|---|---|
| 4,370,196 | 1/1983 | Vossen, Jr. et al. | 156/643 |
| 4,372,807 | 2/1983 | Vossen, Jr. et al. | 156/665 |
| 4,986,877 | 1/1991 | Tachi et al. | 156/665 |
| 5,045,150 | 9/1991 | Cleeves et al. | 156/665 |
| 5,106,471 | 4/1992 | Galvin et al. | 156/665 |
| 5,110,408 | 5/1992 | Fuji et al. | 156/656 |
| 5,174,816 | 12/1992 | Aoyama et al. | 156/625 |
| 5,200,031 | 4/1993 | Latchford | 156/643 |
| 5,221,424 | 6/1993 | Rhoades | 156/643 |

FOREIGN PATENT DOCUMENTS

| | | |
|---|---|---|
| 416774 | 3/1991 | European Pat. Off. . |
| 23633 | 1/1991 | Japan . |

OTHER PUBLICATIONS

S. K. Ghandhi, VLSI Fabrication Principles, John Wiley & Sons, New York, 1983, pp,. 499–503.
S. Wolf et al., Silicon Processing for the VLSI Era; vol. 1, Lattice Press, Sunset Beach, CA, 1986, pp. 559–565.
Japanese Journal of Applied Physics, vol. 19, No. 7, Jul. 1980, pp. L405–L408 "Undercutting Phenomena In Al Plasma Etching".

Primary Examiner—Tom Thomas
Assistant Examiner—Lynne A. Gurley
Attorney, Agent, or Firm—Oliff & Berridge

[57] ABSTRACT

A method for manufacturing a semiconductor device, includes (a) dry-etching an aluminum-containing interconnecting layer, which is formed on a wafer, using reactive gas containing chlorine and/or chloride; (b) converting reactive gas, which contains a compound having at least a hydrogen atom, into a plasma at a temperature of 20° to 150° C. and removing remaining chlorine by activated hydrogen; and (c) converting oxygen-containing reactive gas into a plasma at a temperature of 20° to 150° C. and removing a resist layer chiefly by ashing. If the temperatures in the steps (b) and (c) are set to be low, there would be no obstacle in removing a sidewall protection layer formed by etching the aluminum-containing interconnecting layer.

21 Claims, 4 Drawing Sheets

METHOD OF MAKING AN ALUMINUM CONTAINING INTERCONNECT WITHOUT HARDENING OF A SIDEWALL PROTECTION LAYER

BACKGROUND OF THE INVENTION

1. Field of Invention

The present invention relates to a manufacturing method for a semiconductor device and more particularly to the treatment of the aluminum interconnecting layer after etching.

2. Description of the Related Art

Conventionally, the fixed pattern of the interconnecting layer is formed through using a resist along with gases such as $BCl_3$, $Cl_2$ and the like, after which the resist layer is washed away in oxygen gas at a standard temperature of about 40° C. Then, the residual chlorine is washed away with water and corrosion of the interconnecting layer by the chlorine is prevented.

In the conventional processing method mentioned above, there are problems whereby; the residual chlorine cannot be completely removed, the interconnecting layer is corroded before the water washing treatment, and some residual silicon still remains on the aluminum alloy interconnecting layer even after etching.

Furthermore, the problem with the dry etching after treatment of the aforementioned interconnecting layer is that a sidewall protection layer which is formed in the dry etching process is remoed.

The sidewall protection layer is a kind of protection layer which is formed on the sidewall of the layer to be etched during a step of the anisotropic etching of the interconnecting layer.

This protection layer is thought to have accumulated on the sidewall of the layer to be etched as a product of reactions between radicals in the plasma generated simultaneously with the etching reaction.

In the publication, "JAPANESE JOURNAL OF APPLIED PHYSICS, Vol.19, No.7, July 1980 (pp. L405–L408)", it is proposed that the sidewall protection layer is composed of polymerized organic matter which has separated from the photoresist.

As a result of this sidewall protection layer being formed, undercutting of the layer to be etched is prevented, thus giving a construction where there is anisotropic etching in the vertical direction.

However, even when the sidewall protection layer is still intact after dry etching there are still a number of problems. For example, chlorine remaining on the sidewall protection layer causes corrosion in the metal interconnecting layer. In addition to this, after removal of the photoresist an acute sidewall protection layer still remains on the side of the etched layer and this causes damage to any additional layers formed on top of this layer at later stages.

SUMMARY OF THE INVENTION

It therefore an object of this invention to provide a method of manufacturing a semiconductor device for completely removing the residual chlorine which remains after the etching treatment of the interconnecting layer and thus solve the kind of problems mentioned above.

Another object of the invention is to provide a method of manufacturing a semiconductor device for completely removing the sidewall protection layer.

This invention relates a method for manufacturing a semiconductor device, comprising the steps of:

(a) dry-etching an aluminum-containing interconnecting layer, which is formed on a wafer, using reactive gas containing chlorine and/or chloride;

(b) converting reactive gas, which contains a compound having at least a hydrogen atom, into a plasma at a temperature of 20° to 150° C. and then removing remaining chlorine by activated hydrogen; and (c) converting oxygen-containing reactive gas into a plasma at a temperature of 20° to 150° C. and removing a resist layer chiefly by ashing.

In the construction method of this invention, after the dry etching manufacturing process (a), reactive gas, which contains a compound having at least a hydrogen atom, is converted into a plasma, and this activated hydrogen replaces the chlorine so that the chlorine remaining on the wafer and the interconnecting layer is completely removed.

So, in order to remove the sidewall protection layer the selected temperature during the stages of the manufacturing processes (b) and (c) should be in the region of 20°–150° C. or preferably 20°–100° C. with the most preferable being 20°–60° C.

According to the inventor, for the case where the main part of the layer to be etched is aluminum, there can be seen a characteristic whereby when the temperature exceeds 150° C. there is a hardening in the sidewall protection layer, making it difficult to remove.

In this invention, regarding this view, with respect to the manufacturing processes (b) and (c), by carrying out these processes at a temperature which is less than the temperature at which the protection sidewall hardens, the removal of the sidewall protection layer afterwards by washing can be achieved much more easily.

In this invention, after the manufacturing process (c), the reactive gas consisting of fluorine and carbon becomes a plasma and through chemical vapour deposition (CVD) a fluorocarbon covering is formed. Then, through contact with the air, a chemical corrosion due to the residual chlorine in the interconnecting layer can be completely prevented.

Then the sidewall protection layer can be removed simply by wet washing in, for example, solution of an amino compound.

Another invention relates to a method for manufacturing a semiconductor device, comprising the steps of:

(a) dry-etching an aluminum-containing interconnecting layer, which is formed on a wafer, using reactive gas containing chlorine and/or chloride;

(b) removing chiefly a resist layer and a sidewall protection layer, which is formed in said dry-etching step, by converting reactive gas containing oxygen and fluorine and/or fluorite at a temperature of 20° to 150° C.; and (c) removing said resist layer and remaining chlorine chiefly by converting reactive gas containing oxygen and a compound having at least a hydrogen atom at a temperature of 150° to 250° C.

In this invention, after manufacturing process (a), a temperature range of 20°–150° C. is preferable, with 20°–100° C. being more preferable and 20°–60° C. being the most preferable temperature range. Moreover, by converting a reactive gas containing one of either fluorine or a fluoride compound and oxygen into a plasma a part of the sidewall protection layer and the resist layer can be removed (manufacturing process (b)), After this, at a high temperature stage temperature of 20°–250° C. or preferably 100°–250° C. with 150°–250° C. being the most preferable, by converting a reactive gas containing oxygen and a chemical compound with at least one hydrogen atom into a plasma the resist layer and the residual chlorine can be completely removed. (manufacturing process (c)).

Regarding the manufacturing process (b) for the invention and the manufacturing process (c) for another invention, a chemical compound is used which contains at least one hydrogen atom and at least one selected from the following; an aliphatic alcohol with a carbon number in the range of 1 to 4, an aliphatic hydro-carbon with a carbon number in the range of 1 to 4, hydrogen and/or water. Due to safety and handling considerations, an aliphatic alcohol with a carbon number in the range of 1 to 4, in particular methyl alcohol is preferable for the chemical compound containing at least one hydrogen atom. An aliphatic hydro-carbon with a carbon number in the range of 1 to 4, in particular the likes of ethane or methane can also be used.

DETAILED DESCRIPTION

First Embodiment

FIGS. 1–5 are cross-sectional diagrams showing the step by step processes in this embodiment.

Figure 1:
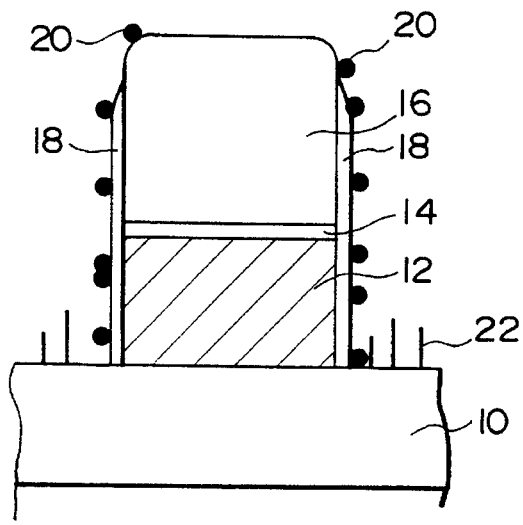
FIG. 1 is a cross-sectional diagram showing a semiconductor device after the plasma etching process according to the first embodiment of the present invention.

(a) In the manufacturing process shown in FIG. 1, the aluminum alloy layer (12) from which the interconnecting layer will be constructed is formed on the silicon oxide layer (10) of the silicon wafer by using a known method, such as sputter method, with an anti-reflective coating (14) being formed on top of this aluminum alloy layer (12) as interconnecting layer.

Here, the aluminum alloy layer (12) is made from the likes of, for example, an aluminum silicon alloy (AlSi), AlCu, or AlSiCu having a thickness of, for example between 5000–10000 Angstroms. As the anti-reflective coating (14) is to prevent unwanted light reflections from the aluminum alloy layer when it is exposed to light, the likes of for example Titanium Nitride (TiN) or TiW can be used for this anti-reflection film having a thickness of, for example between 200–1000 Angstroms.

The resist layer (16) is then formed on the anti-reflective coating (14), with this resist typically having a thickness of 15000–20000 Angstroms.

For the purposes of this example the aluminum alloy layer (12) will have a thickness of 8000 Angstroms, the anti-reflective coating (14) will have a thickness of 500 Angstroms and the resist layer (16) will have a thickness of 18000 Angstroms.

The following conditions are selected in order to carry out this kind of wafer etching.
Reactive gas:

$Cl_2$ rate of flow: 50–100 SCCM (cc/min. under standard conditions)

$BCl_3$ rate of flow: 20–80 SCCM

Pressure: 5–20 mTorr

Microwave output: 400–1000 W

Radio requency output: 50–150 W

Stage temperature 20°–60° C.

In keeping with the above experimental conditions, a $Cl_2$ rate of flow of 90 SCCM, a $BCl_3$ rate of flow of 60 SCCM, a pressure of 16 mTorr, a microwave output of 800 W and a radio frequency output of 90 W were chosen. For the purposes of this example, the light emitted from 396 nm of aluminum was monitored, a light intensity during etching of 70% was chosen as a finishing point. After this a radio frequency output of 60 W was maintained for an over-etching time period corresponding to half of the time which has passed up to that point. In this case, the finishing point of 76 seconds was decided with the over-etching time period being 38 seconds, meaning that a total of 114 seconds were necessary.

When this kind of plasma etching has finished, as shown in FIG. 1, the silicon in the aluminum layer has not been completely etched away and some silicon (22) still remains on the surface of the silicon oxide layer (10). Also, a sidewall protection layer (18) created during the etching process exists on the sidewall of the aluminum alloy layer (12), the anti-reflective coating (14) and the resist layer (16). Additionally, some chlorine (20) remains on the surface of this sidewall protection layer (18).

Figure 2:
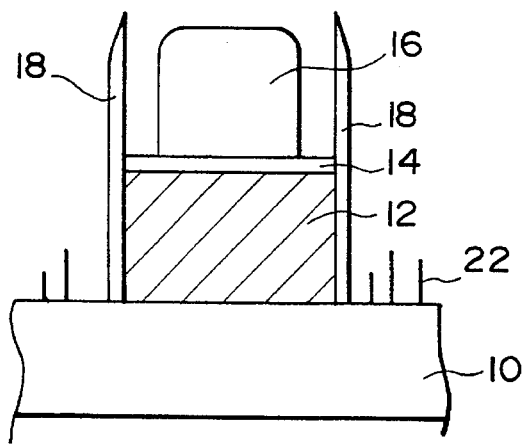
FIG. 2 is a cross-sectional diagram showing a semiconductor device after the ashing treatment to remove the residual chlorine according to the first preferred embodiment.

(b) In the manufacturing process shown in FIG. 2, the wafer is taken to a separate chamber for ashing in vacuum, and provided that the ashing is carried out under the following conditions the residual chlorine (20) and one part of the resist layer (16) can be completely removed.
Reactive gas:

$O_2$ rate of flow: 100–300 SCCM $CH_3OH$ rate of flow: 10–50 SCCM

Pressure: 0.5–2 Torr

Microwave output: 500–1000

Stage temperature: 20°–150° C.

Ashing time period: 30–120 seconds

Example values chosen for the aforementioned experimental conditions were as follows; a rate of flow of $O_2$ of 200 SCCM, a rate of flow of $CH_3OH$ of 40 SCCM, a pressure of 1 Torr, a microwave output of 1 KW, a stage temperature of 40° C. and an ashing time period of 60 seconds. By using these experimental conditions for the ashing treatment the residual chlorine and one part of the resist layer (16), as shown in FIG. 2, can be almost completely removed.

Figure 3:
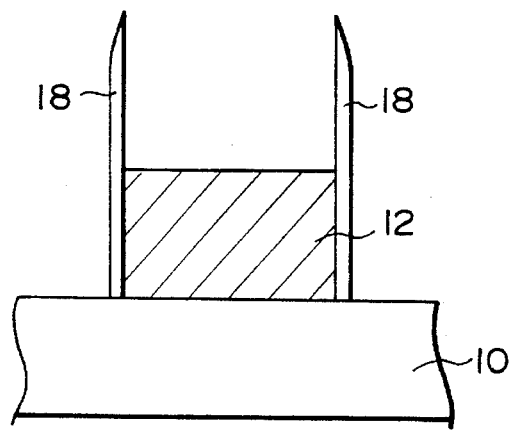
FIG. 3 is a cross-sectional diagram of a semiconductor device after the ashing treatment to remove the resist layer and the anti-reflective coating according to the first preferred embodiment.

(c) In the production method shown in FIG. 3, a mixture of $O_2$ and $CHF_3$ is selected as the reactive gas for the ashing process. At this time the experimental conditions are as follows.

Reactive gas:

$O_2$ rate of flow: 100–300 SCCM $CHF_3$ rate of flow: 5–20 SCCM

Pressure: 0.5–2 Torr

Microwave output: 500–1000 W

Stage temperature 20°–150° C.

Ashing time period: 30–120 seconds

Example values chosen for the aforementioned experimental conditions were as follows; a rate of flow $O_2$ of 100 SCCM, a rate of flow of $CHF_3$ OF 10 SCCM, a microwave output of 800 W, a stage temperature of 40° C. and an ashing time period of 60 seconds.

The resist layer (16) and the anti-reflective coating (14) are completely removed by the ashing process and the remaining silicon (22) is also removed at the same time.

Figure 4:
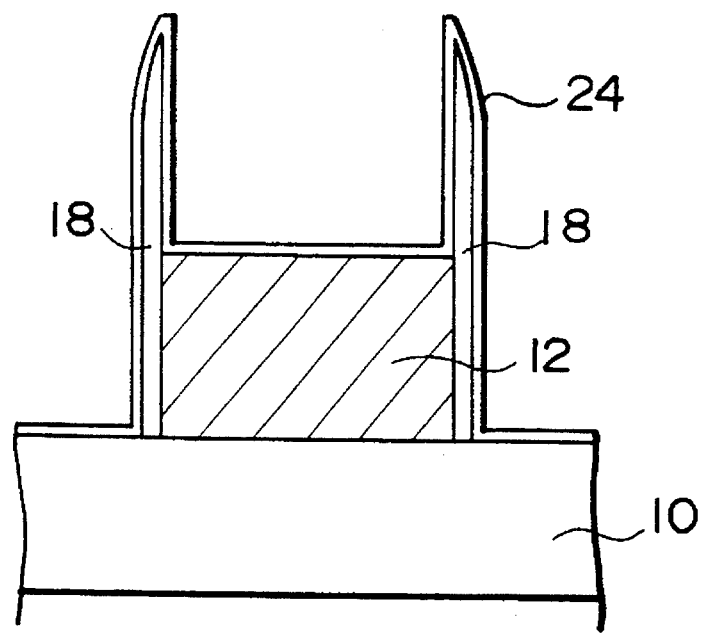
FIG. 4 is a cross-sectional diagram of a semiconductor device with a fluorocarbon covering formed on it by the plasma CVD method according to the first embodiment.

(d) In the manufacturing process in FIG. 4, a plasma was generated under the following conditions and a fluorocarbon covering was formed.

Reactive gas:

$CHF_3$ rate of flow 50–200 SCCM

Pressure: 0.5–2 Torr

Microwave output: 500–1000 W

Stage temperature: 20°–100° C.

Treatment time period 10–30 seconds

Example values chosen for the aforementioned experimental conditions were as follows; a rate of flow of $CHF_3$ of 100 SCCM, a pressure of 1 Torr, a microwave output of 1 KW, a stage temperature of 40° C. and a treatment time period of 10 seconds. In setting up this kind of example, the fluorocarbon covering (a protection overcoating) (24) over the whole of the surface of the wafer is formed at a film thickness of 500 Angstroms.

In this manufacturing process the reactive gas can be replaced with any of the following; $CH_2F_2$, $CH_3F$ or the like.

Since the interconnecting layer is protected by the fluorocarbon covering (24), even if there exists only a small quantity of residual chlorine or if the layer is exposed to the atmosphere during subsequent wet washing it is possible to prevent the interconnecting layer from undergoing any corrosion due to the residual chlorine.

Figure 5:
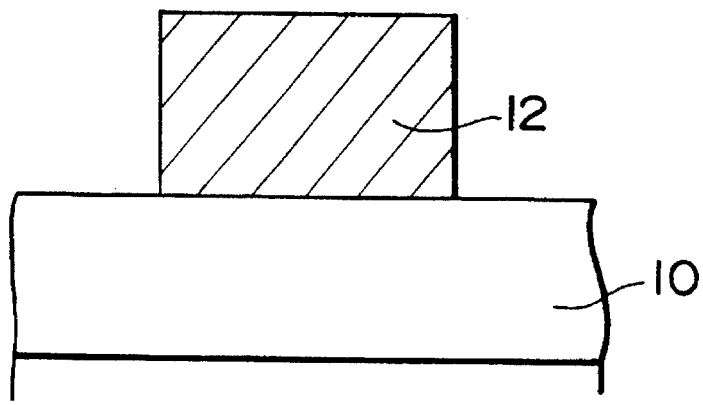
FIG. 5 is a cross-sectional diagram of a semiconductor device with the fluorocarbon covering and the sidewall protection layer removed by wet washing according to the first embodiment.

(e) In the manufacturing process shown in FIG. 5, the sidewall protection layer (18) and the fluorocarbon covering (24) can be removed simply by wet washing in solution of solution of an amino compound such as methyl-amino, ethyl-amino or the like.

By employing the above mentioned manufacturing processes (a)–(e), the residual chlorine can be completely removed and simply by employing a wet washing method the sidewall protection layer can also be removed.

Figure 9:
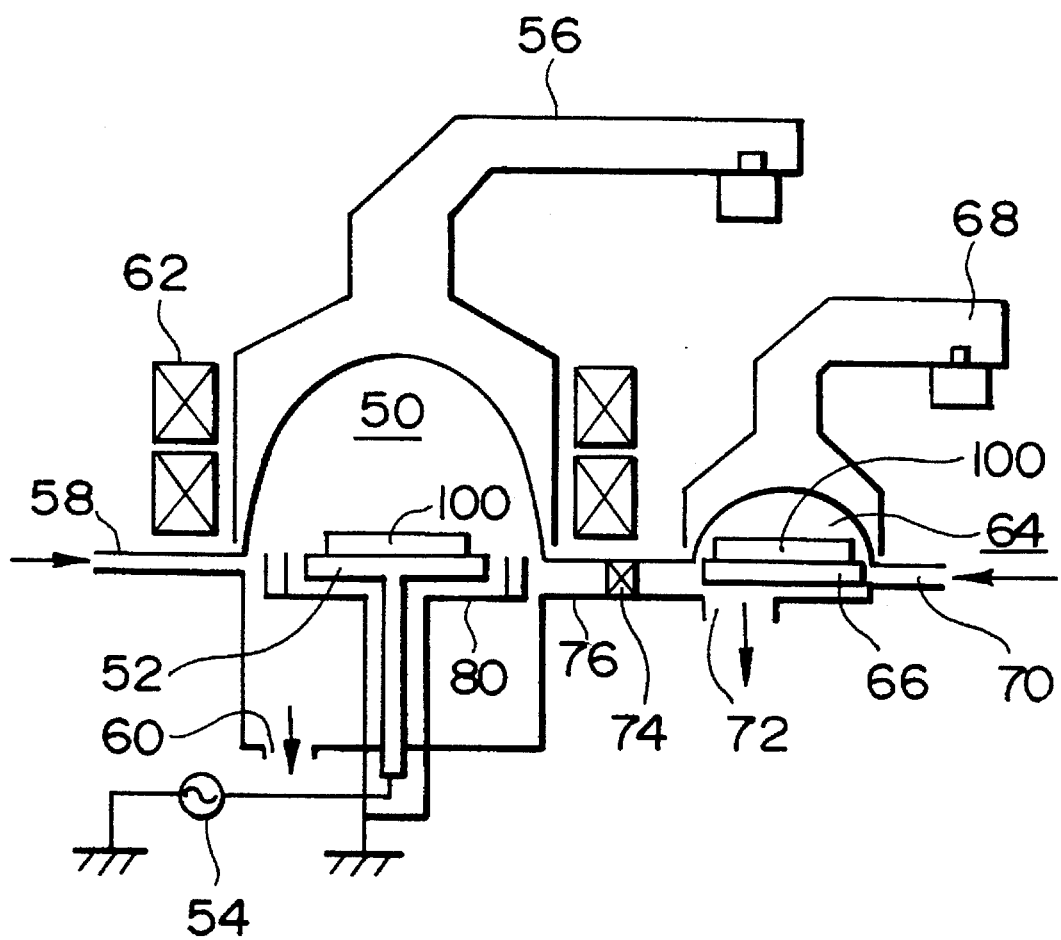
FIG. 9 is a cross-sectional diagram of one example of apparatus for carrying out the manufacturing method of the present invention.

FIG. 9 is an outline diagram of one example of an apparatus which can be used for sequentially carrying out the manufacturing processes described above (a)–(d). In this apparatus the etching chamber (50) and the ashing chamber (64) are connected by a passage (78) running between them.

Inside the etching chamber (50) the wafer (100) is set up on top of a supporting platform or stage (52), with this supporting platform (52) in turn being connected a radio frequency supply (54). The etching chamber (50) is also arranged with a gas inlet (58) and outlet (60) for the passage of the gas, in addition to a solenoid coil (62) and a microwave waveguiding pipe (56) for creating the plasma. In the diagram, (80) is the earthing element.

In the ashing chamber (84), there is a supporting platform or stage (66) for supporting the wafer (100), a gas inlet (70) and a gas outlet (72) and a microwave waveguiding pipe (68). Additionally, there is valve (74) provided for the connecting passage (76).

By using this kind of apparatus, after performing the plasma etching in the etching chamber (50) for the aforementioned manufacturing process (a) and by having a wafer transportation means, which is not shown in the diagram, the wafer (100) can be transported in a vacuum to the ashing chamber (64), whereby the manufacturing processes (b)–(d) can be sequentially carried out.

Second Embodiment

Figure 6:
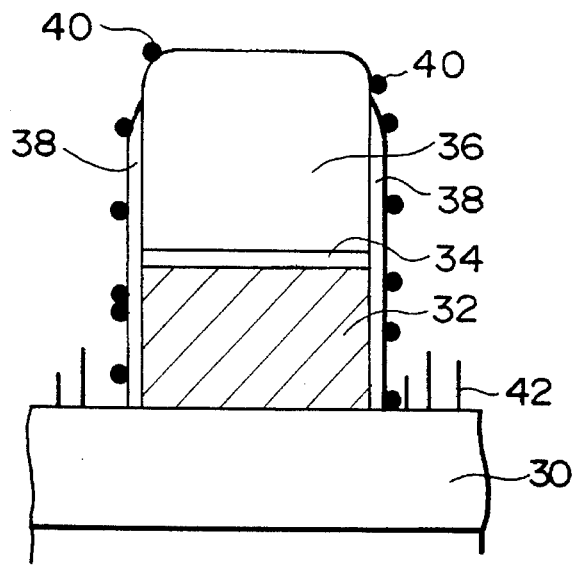
FIG. 6 is a cross-sectional diagram of a semiconductor device after plasma etching according to a second embodiment of the present invention.
Figure 7:
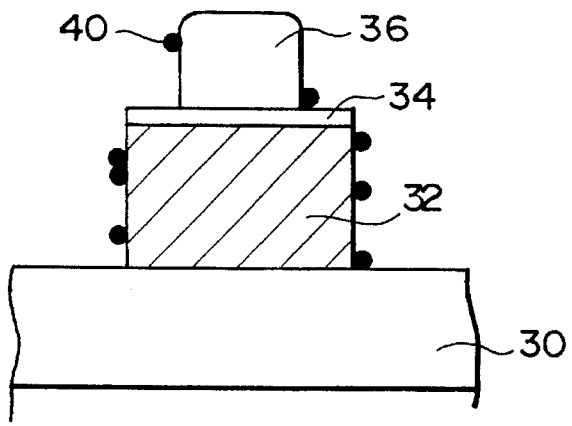
FIG. 7 is a cross-sectional diagram of a semiconductor device with the sidewall protection layer and one part of the resist layer removed by an ashing treatment according to the second embodiment.
Figure 8:
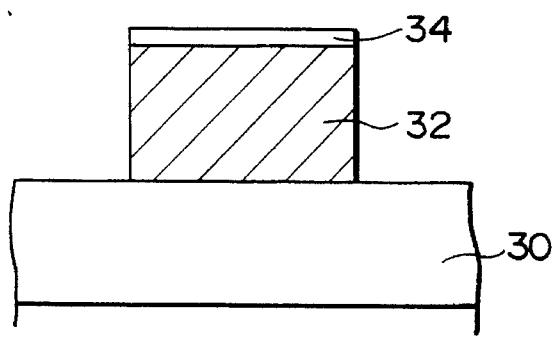
FIG. 8 is a cross-sectional diagram of a semiconductor device with the resist layer and the residual chlorine removed by an ashing treatment according to the second embodiment.

FIGS. 6 to 8 are outline drawings of the kind of process in this preferred embodiment.

(a) In the production method in FIG. 6, a interconnecting layer made of aluminum alloy is formed on one part of the silicon oxide layer (30) by a method such as the commonly known sputter method. The anti-reflective coating (34) is then formed on top of this aluminum alloy layer (32).

Here, the aluminium alloy layer (32) can be made from, for example, aluminium-silicon alloy (AlSi), AlCu, AlSiCu or the like with a thickness of, for example, 5000–10000 Angstroms. For the anti-reflective coating (34) the likes of Titanium Nitride (TiN) or TiW can be used, with a layer thickness of, for example, from 200–1000 Angstroms.

A resist layer (36) is then formed on top of the anti-reflective coating (34), with this resist typically having a thickness of 15000–20000 Angstroms.

For the purposes of this example the following layer thicknesses were selected; the aluminium alloy layer (32) is 8000 Angstroms, the anti-reflective coating (34) is 500 Angstroms and the resist layer (36) is 18000 Angstroms. In this kind of wafer etching, plasma etching is carried out under the following conditions.

Reactive gas:

$Cl_2$ rate of flow 50–100 SCCM (cc/minute under standard conditions)

$BCl_3$ rate of flow 20–80 SCCM

Pressure: 5–20 mTorr

Microwave output: 400–1000 W

Radio frequency output: 50–150 W

Stage temperature 20°–60° C.

In keeping with the above experimental conditions, a $Cl_2$ rate of flow of 90 SCCM, a $BCl_3$ rate of flow of 60 SCCM, a pressure of 16 mTorr, a microwave output of 800 W and a radio frequency output of 90 W were chosen. For the purposes of this example, the light emitted from 396 nm of aluminium was monitored and a light intensity during etching of 70% was chosen as a finishing point. After this a radio frequency output of 60 W was maintained for an over-etching time period corresponding to half of the time which has passed up to that point. In this case, the finishing point of 76 seconds was decided with the over-etching time period being 38 seconds, meaning that a total of 114 seconds were necessary.

When this kind of plasma etching has finished, as shown in FIG. 6, all of the silicon in the aluminium layer has not been etched away so some silicon (42) still remains on the surface of the silicon oxide layer (30). Also, a sidewall protection layer (38) created during the etching process exists on the sidewall of the aluminium alloy layer (32), the anti-reflective coating (34) and the resist layer (36). Additionally, some chlorine (40) remains on the surface of this sidewall protection layer (38).

(b) In the manufacturing process shown in FIG. 7, the wafer is taken to a separate chamber for ashing in vacuum, and provided that the ashing is carried out under the following conditions the sidewall protection layer (38), the residual silicon (42) and one part of the resist layer (36) can be completely removed.

Reactive gas:

$O_2$ rate of flow: 100–300 SCCM $CHF_3$ rate of flow: 5–20 SCCM

Pressure: 0.5–2 Torr

Microwave output: 500–1000 W

Stage temperature: 20°–150° C.

Ashingtime period: 30–120 seconds

Example values chosen for the aforementioned experimental conditions were as follows; a rate of flow of $O_2$ of 200 SCCM, a rate of flow of $CHF_3$ of 20 SCCM, a pressure of 1 Torr, a microwave output of 1 KW, a stage temperature of 100° C. and an ashing time period of 60 seconds. By using these experimental conditions for the ashing treatment, the sidewall protection layer (38) can be completely removed. Additionally, one part of the residual chlorine (40) can be removed.

(c) In the manufacturing process in FIG. 8, the residual chlorine (40) and resist layer (36) are removed under the following conditions.

Reactive gas:

$O_2$ rate of flow 100–300 SCCM $CH_3OH$ rate of flow 10–50 SCCM

Pressure: 0.5–2 Torr

Microwave output: 500–1000 W

Stage temperature: 150°–250° C.

Ashing time period: 30–120 seconds

Example values chosen for the aforementioned experimental conditions were as follows; a rate of flow of $O_2$ of 200 SCCM, a rate of flow of $CH_3OH$ of 40 SCCM, a pressure of 1 Torr, a microwave output of 800 W, a stage temperature of 250° C. and an ashing time period of 60 seconds. In doing this the resist layer (36) and the residual chlorine (40) can be completely removed.

In the aforementioned manufacturing processes (a)–(c), after the sidewall protection layer has been removed by the manufacturing process (b), it becomes possible by using the high stage temperature ashing process to remove the residual chlorine, as well as the resist layer, completely.

The above is an explanation of the principal preferred embodiments of the present invention. However, the present invention is not just limited to these embodiments, and various kinds of modifications within the essential scope of the invention are possible. For example, in the case of the reactive gas, various things can be selected for this process. Also for example, in the plasma etching process, $CCl_4$, HCl, $SiCl_4$, $Br_2$, $BBr_3$ and the like can be used in addition to $Cl_2$ and $BCl_3$. In the ashing manufacturing process, $CH_2F_2$, $CH_3F$, $CF_4$ and the like in addition to $O_2$ and $CHF_3$ can be used.

Alternatively, using a hydro-carbon compound as the chemical compound having at least a hydrogen carbon atom will attain results identical to those attained in the preferred embodiment. In using methane as the hydro-carbon compound, the following can be adopted as the conditions in the manufacturing process (b) for the first preferred embodiment.

Reactive gas:

$O_2$ rate of flow 100–300 SCCM $CH_4$ rate of flow 10–50 SCCM

Pressure: 0.5–2 Torr

Microwave output: 500–1000 W

Stage temperature: 20°–150° C.

Ashing time period: 50–120 seconds

By not preventing the removal of the sidewall protection layer formed by the etching treatment of the aluminium interconnecting layer, a production method can be forwarded for a semiconductor apparatus which can remove the residual chlorine in a simple manner.

What is claimed is:

1. A method for manufacturing a semiconductor device, comprising the steps of:

(a) dry-etching an aluminum-containing interconnecting layer, which is formed on a wafer, using reactive gas containing at least one of chlorine and chloride, wherein said dry-etching forms a sidewall protection layer;

(b) converting a second reactive gas, which contains a compound or hydrogen element having at least a hydrogen atom, into a plasma thereby activating the hydrogen and then removing chlorine from the wafer and the interconnecting layer by activated hydrogen at a temperature of 20° to 150° C.;

(c) converting a third reactive gas, which comprises oxygen into a plasma and removing a resist layer which has been formed over the interconnecting layer by ashing at a temperature of 20° to 150° C.; wherein said steps (b) and (c) are conducted without substantially hardening said sidewall protection layer of said interconnecting layer, and (d) removing said sidewall protection layer.

2. A method according to claim 1, wherein the compound or hydrogen element to be used in step (b) comprises at least one member selected from the group consisting of aliphatic alcohols having 1–4 carbon atoms, aliphatic hydrocarbons having 1–4 carbon atoms, hydrogen and water.

3. A method according to claim 1, wherein oxygen coexists with said reactive gas in step (b).

4. A method according to claim 3, wherein the flow rate of said compound ranges from 10 to 50 SCCM, and the flow rate of oxygen ranges from 100 to 300 SCCM.

5. A method according to claim 1, wherein said temperature in the step (b) ranges from 20° to 100° C.

6. A method according to claim 1, wherein at least one of fluorine and fluoride coexists with said reactive gas in step (c).

7. A method according to claim 1, wherein said temperature in step (c) ranges from 20° to 100° C.

8. A method according to claim 1, further including, (d) forming a protection overcoating containing fluorocarbon by converting a fourth reactive gas containing at least fluorine and carbon atoms into a plasma.

9. A method according to claim 8, wherein after said protection overcoating forming step, a sidewall protection layer formed in said dry-etching step and said protection overcoating are removed using a solution of an amino compound.

10. A method according to claim 1, wherein said wafer is transferred in vacuum when said step (a) proceeds to step (b), and said steps (b) and (c) are performed in the same chamber.

11. A method for manufacturing a semiconductor device, comprising the steps of:

(a) dry-etching an aluminum-containing interconnecting layer, which is formed on a wafer, using reactive gas containing at least one of chlorine and chloride;

(b) removing at a temperature of 20° to 150° C. a resist layer and a sidewall protection layer, which is formed in said dry-etching step, by converting a second reactive gas containing oxygen and at least one of fluorine and fluoride into a plasma whereby said sidewall protection layer is removed without substantial hardening; and (c) removing remaining chlorine at a temperature of 150° to 250° C. by converting a third reactive gas containing oxygen and a compound or hydrogen element having at least a hydrogen atom into a plasma.

12. A method according to claim 11, wherein said temperature in step (b) ranges from 20° to 100° C.

13. A method according to claim 11, wherein said fluoride in step (b) is one selected from the group consisting of $CF_4$, $CHF_3$, $CH_2F_2$ and $CH_3F$.

14. A method according to claim 11, wherein the flow rate of oxygen in step (b) ranges from 100 to 300 SCCM, and the flow rate of at least one of fluorine and fluoride ranges from 5 to 20 SCCM.

15. A method according to claim 11, wherein said compound or hydrogen element to be used in step (c) comprises at least one member selected from the group consisting of aliphatic alcohols having 1–4 carbon atoms, aliphatic hydrocarbons having 1–4 carbon atoms, hydrogen and water.

16. A method according to claim 11, wherein the flow rate of said compound in step (c) ranges from 10 to 50 SCCM, and the flow rate of oxygen ranges from 100 to 300 SCCM.

17. A method according to claim 11, wherein said temperature in step (c) ranges from 200° to 250° C.

18. A method according to claim 11, wherein said wafer is transferred in vacuum when said step (a) proceeds to step (b), and said steps (b) and (c) are performed in the same chamber.

19. A method for manufacturing a semiconductor device, comprising the steps of:

(a) dry-etching an aluminum-containing interconnecting layer, which is formed on a wafer, using reactive gas containing at least one of chlorine and chloride, wherein said dry-etching forms a sidewall protection layer;

(b) converting a second reactive gas, which contains methyl alcohol, into a plasma at a temperature of 20° to 150° C. thereby activating the hydrogen of said methyl alcohol and removing chlorine remaining on the wafer and the interconnecting layer by activated hydrogen; and (c) converting a third reactive gas, which comprises oxygen, into a plasma at a temperature of 20° to 150° and removing a resist layer, which has been formed over the interconnecting layer, by ashing; wherein steps (b) and. (c) are conducted without substantially hardening said sidewall protection layer of said interconnecting layer.

20. A method for manufacturing a semiconductor device, comprising the steps of:

(a) dry-etching an aluminum-containing interconnecting layer, which is formed on a wafer, using reactive gas containing at least one of chlorine and chloride;

(b) removing a resist layer and a sidewall protection layer, which is formed in said dry-etching step, by converting reactive gas containing oxygen and at least one of fluorine and fluoride to plasma at a temperature of 20° to 150° C.; whereby said sidewall protection layer is removed without substantially hardening and (c) removing remaining chlorine by converting reactive gas containing oxygen and methyl alcohol to plasma at a temperature of 150° to 250° C.

21. A method for manufacturing a semiconductor device, comprising the steps of:

(a) dry-etching an aluminum-containing interconnecting layer, which is formed on a wafer, using reactive gas containing at least one of chlorine and chloride;

(b) removing a resist layer and a sidewall protection layer, which is formed in said dry-etching step, by converting reactive gas containing oxygen and at least one of fluorine and fluoride to plasma at a temperature of 20° to 150° C.; whereby said sidewall protection layer is removed without substantially hardening and (c) removing remaining chlorine by converting reactive gas containing oxygen and a compound having at least a hydrogen atom to plasma at a temperature of 200° to 250° C.

* * * * *